United States Patent [19]
Stals et al.

[11] Patent Number: 5,646,540
[45] Date of Patent: Jul. 8, 1997

[54] APPARATUS AND METHOD FOR MEASURING ELECTROMAGNETIC AGEING PARAMETER OF A CIRCUIT ELEMENT AND PREDICTING ITS VALUES

[75] Inventors: Lambert Mathias Maria Stals, Diepenbeek; Luc Irena Franciscus De Schepper, Hasselt; Ward Aimè Stefan De Ceuninck, Avelgem; Jean Joseph Marie Roggen, Lummen, all of Belgium

[73] Assignees: Interuniversitair Micro-Elektronic Centrum VZW, Leuven-Heverlee; Limburgs Universitair Centrum, Diepenbeek, both of Belgium

[21] Appl. No.: 372,383

[22] Filed: Jan. 13, 1995

Related U.S. Application Data

[63] Continuation-in-part of Ser. No. 83,385, Jun. 28, 1993, abandoned, which is a continuation of Ser. No. 656,045, filed as PCT/EP90/00291, Apr. 19, 1990, abandoned.

[30] Foreign Application Priority Data

Apr. 19, 1989 [NL] Netherlands ............... 89.00982
Nov. 22, 1989 [NL] Netherlands ............... 89.02891

[51] Int. Cl.$^6$ .................................... G01R 31/02
[52] U.S. Cl. ................. 324/691; 324/760; 395/180
[58] Field of Search ................ 324/760, 691; 395/180

[56] References Cited

U.S. PATENT DOCUMENTS

| | | | |
|---|---|---|---|
| 2,696,739 | 12/1954 | Endres | 324/158 T |
| 3,264,448 | 8/1966 | Lehmer | 219/210 |
| 3,823,685 | 7/1974 | Koepp et al. | |
| 3,842,346 | 10/1974 | Bobbit | 324/537 |
| 3,962,559 | 6/1976 | Drda et al. | 219/210 |
| 4,374,317 | 2/1983 | Bradshaw | |

(List continued on next page.)

FOREIGN PATENT DOCUMENTS 0168518 1/1986 European Pat. Off. .
970426 9/1964 United Kingdom .

OTHER PUBLICATIONS

K. Hoffmann, et al. "Ein neues Verfahhren zur Bestimmung der Lebensdauer von elektronischen Bauelementen, " *Frequenz*, vol. 35, No. 7, pp. 188–190 (Jul. 1981).

V. Ya Cherepanov, "Simultaneous Measurement of the Integral Emittance and the Temperature Dependence of Electrical Resistance by a Modulation Method," *Measurement Techniques*, vol. 24, No. 9, pp. 762–767 (Sep. 1981).

*Primary Examiner*—Kenneth A. Wieder
*Assistant Examiner*—Diep Do
*Attorney, Agent, or Firm*—Limbach & Limbach L.L.P.

[57] ABSTRACT

An apparatus and method for determining the reliability of an electronic component by performing measurements which enable the ageing behavior of a parameter of that component to be predicted over time. The parameter measurements are made in-situ within the oven or environment used to control the temperature at which the measurements are made. The oven is controlled so that its temperature is kept stable, thereby permitting very high resolution measurements to be made over a relatively short time span. The temperature stability of the oven ensures that the changes of the electromagnetic parameter to be measured as a result of temperature fluctuations are negligible relative to the changes as a result of the ageing phenomena which occur in the component over time. The high resolution measurements are then used to model the parameter value as a function of time based on a deterministic model of how that parameter of the component varies over the lifetime of the component. The model is extrapolated over time to determine the reliability of the component as it ages. The result of the invention is a reliable prediction of the component's parameter value as a function of time, which enables a user or manufacturer to know when the parameter value will exceed its intended tolerance values, and either fail or cause the device in which it is incorporated to become unreliable.

21 Claims, 4 Drawing Sheets

U.S. PATENT DOCUMENTS

| | | | |
|---|---|---|---|
| 4,445,024 | 4/1984 | Carden . | |
| 4,520,448 | 5/1985 | Tremintin | 324/768 |
| 4,547,648 | 10/1985 | Longeway | 210/210 |
| 4,554,437 | 11/1985 | Wagner et al. . | |
| 4,577,149 | 3/1986 | Zbinden | 324/537 |
| 4,684,783 | 8/1987 | Gore | 219/210 |
| 4,777,434 | 10/1988 | Miller et al. . | |
| 4,782,291 | 11/1988 | Blandin . | |
| 4,881,591 | 11/1989 | Rignall | 219/210 |
| 5,030,905 | 7/1991 | Figal | 324/760 |
| 5,036,273 | 7/1991 | Groeseneken et al. | 324/158 T |
| 5,047,713 | 9/1991 | Kirino et al. | 324/158 T |
| 5,219,765 | 6/1993 | Yoshida et al. | 324/158 T |
| 5,309,090 | 5/1994 | Lipp | 219/209 |

APPARATUS AND METHOD FOR MEASURING ELECTROMAGNETIC AGEING PARAMETER OF A CIRCUIT ELEMENT AND PREDICTING ITS VALUES

RELATED APPLICATION

This application is a Continuation-In-Part of U.S. pat. application ser. no. 08/083,385, filed Jun. 28, 1993, by Stals et al., abandoned, which is a continuation of U.S. pat. application Ser. No. 07/656,045, filed Feb. 14, 1991, claiming priority from PCT application EP90/00291, filed Apr. 19, 1990, abandoned, and entitled "Method and Device for Accelerated Determining of Ageing Parameter of One or More Elements With an Electromagnetic Ageing Parameter", which claimed priority from Netherlands application 89.00982, filed Apr. 19, 1989.

TECHNICAL FIELD

The present invention relates to apparatus and methods for evaluating the reliability of electrical components, and in particular, to methods and devices for predicting the value of an electromagnetic parameter of a component as the component ages.

BACKGROUND OF THE INVENTION

The long-term reliability of electronic components is of crucial importance in modern industry. Reliability issues arise both in terms of whether a particular component will continue to operate over time, and whether a parameter value of a component will fall within a desired range of values as the component ages. Therefore, there is an increasing demand for realistic predictions of the lifetimes of active electronic components and of the components' parameter values during those lifetimes. This same need also exists for lower level components, including conductive components such as metallization lines, wire bonds, or bumps, resistors (thick or thin film), capacitors, and dielectrics which are used for the packaging, joining and assembling of semiconductor devices. Knowledge of the physical phenomena which occur during the operation and ageing of such devices (based on drift kinetics or other models of the behavior) can be used to predict the timescale over which a device will operate within a desired range of values, or to take appropriate actions at the design level to produce a component having a desired set of characteristics.

In many cases, the reliability and lifetime of a component are estimated from accelerated ageing tests performed under well defined conditions. In a conventional ageing test designed to measure a component's resistance and predict that parameter over time, the resistance is determined for a sequence of time intervals $t_i$ at an ageing temperature $T_1$ (where $T_1$>room temperature). In addition, the electrical resistance is measured at room temperature in between two ageing intervals to provide a reference point. The goal is to estimate the resistance drift as a function of time based on the measured data, for times exceeding those over which the measurements are made. However, the conventional ageing method has several disadvantages:

1) The ageing treatment has to be interrupted to measure the electrical resistance at room temperature. This has the effect of restricting the number of data points obtained during a test or extending the time required to conduct the testing. The low number of data points prevents performing a realistic analysis of the ageing kinetics;

2) The parameter measurement circuit has to be reconnected after each annealing (heating) step. This is time consuming and can negatively impact the resolution of the parameter measurements because of temperature induced fluctuations of the parameter value, and the need to recalibrate the measurement device;

3) Room temperature fluctuations induce variations in the measured data due to the temperature coefficient of the electrical parameter being measured. For example, with a TCR (temperature coefficient of resistance) of 100 ppm (parts-per-million)/°C., room temperature fluctuations of 1 ° C. induce a spreading of the measured results on the order of about 100 ppm. This decreases the resolution of the parameter measurements;

4) The idealized temperature-time profile used to analyze the measured data is only an approximation. In reality, a certain time is needed after each resistance measurement to warm up the furnace to the ageing temperature $T_1$, and an oversteering of the temperature can occur. Both of these effects disturb the pure isotherm character of the ageing process and introduce errors in the kinetic analysis; and 5) As a consequence of the noted problems, the resolution of the measured resistance drift, $dR/R_0$, using the conventional ageing method is rather poor, typically a few hundred ppm. A total drift which is a few orders of magnitude larger than the measurement resolution is generally required to properly perform an ageing analysis based on kinetics theory. Unfortunately, such a drift can only be achieved after several thousand hours of ageing using good quality materials. This makes such measurements impractical for many applications.

Because of the time-consuming character of placing a component having an ageing parameter in an environment with a raised temperature, subsequently measuring the changed parameter, and repeating this cycle until sufficient measurements are made to permit a reliable prediction of the parameter value over time, this method is particularly disadvantageous for systems where a small change of the parameters occurs. With the described method a typical value for the measurement error is 100 ppm. In such a situation an ageing to 10,000 ppm is necessary in order to predict the parameter value as a function of time based on extrapolations of the change in the parameter during the test period. Measuring wires, such as current and voltage wires have to be connected and disconnected again each time, while some time is necessary in each case to reach a desired degree of stability and temperature of the oven. The instability of the oven temperature when switching measurement and heating equipment on and off also contributes to inaccuracies in the measurements.

In addition, measurements may be carried out under various conditions, such as in a helium atmosphere, in air, in polluted air for sensors used in determining the degree of air pollution, in an $0_2$ atmosphere, or in an atmosphere of moistened air. In such situations it is important that the desired conditions are maintained within an acceptable tolerance range during the course of the measurements. This can become difficult to achieve if the equipment containing the component is regularly opened up in order to make measurements of an ageing parameter.

Component reliability is also sometimes examined by stressing a device in order to determine if it will operate properly. This is done to identify components which fail to operate properly so that they can be segregated from those that successfully pass the stress test. This type of testing, often termed "burn-in testing" is actually a form of quality control rather than a determination of the value of an ageing parameter. Such testing methods can be used to determine if a component will operate under the conditions of the test, but are not suited to determining the value of a component's electromagnetic parameter over the lifetime of the component.

U.S. Pat. No. 4,374,317, issued Feb. 15, 1983 to Bradshaw, discloses an improved means of connecting a component board located within an oven to control circuitry as part of "burning-in" the component board. Bradshaw's burning-in method includes subjecting the board to a high temperature environment, operating the component(s) contained on the board at that high temperature, and detecting failures of the components. Bradshaw does not teach conducting in-situ measurements of the components. Furthermore, Bradshaw is concerned with determining how well a component or components operate when stressed, so that components which fail to operate properly can be segregated from those that pass the burn-in test. Bradshaw is not concerned with predicting how a component will function over its lifetime by determining how its parameter value changes.

U.S. Pat. No. 3,842,346, issued Oct. 15, 1974 to Bobbitt, discloses an apparatus for and method of testing integrated circuits during a change in temperature to determine if the circuits maintain their electrical continuity. This is done for the purpose of identifying any intermittent circuit connections which may be present. Thus, Bobbitt is also directed to quality control of the tested circuits by assuring that the circuits will operate under the thermal conditions to which they are exposed.

What is desired is an apparatus and method for making reliable high resolution measurements of a component's electromagnetic ageing parameter within a shorter time period than required by current techniques. It is also desired to have a method for using these measurements to predict a component's electromagnetic parameter values as the component ages.

SUMMARY OF THE INVENTION

The present invention is directed to an apparatus and method for determining the reliability of an electronic component by performing measurements which enable the behavior of a parameter of that component to be predicted over time. The parameter measurements are made in-situ, that is within the oven or environment used to control the temperature at which the measurements are made. The oven is controlled so that its temperature is kept extremely stable, thereby permitting very high resolution measurements to be made over a relatively short time span. The temperature stability of the oven ensures that changes in the value of the electromagnetic parameter as a result of temperature fluctuations are negligible relative to changes as a result of the ageing phenomena which occur in the component over time. This acts to isolate the source of the parameter variations.

The high resolution measurements are used to model the parameter value as a function of time based on a deterministic model of how that parameter of the component varies over the lifetime of the component. The results of this model are then extrapolated over time to evaluate the reliability of the component as it ages. The result of the invention is a prediction of the component's parameter value as a function of time, which enables a user or manufacturer to know when the parameter value will exceed its intended tolerance values and either fail, or cause the device in which it is incorporated to operate improperly.

Further objects and advantages of the present invention will become apparent from the following detailed description and accompanying drawings.

DETAILED DESCRIPTION OF THE PREFERRED EMBODIMENT

Figure 1:
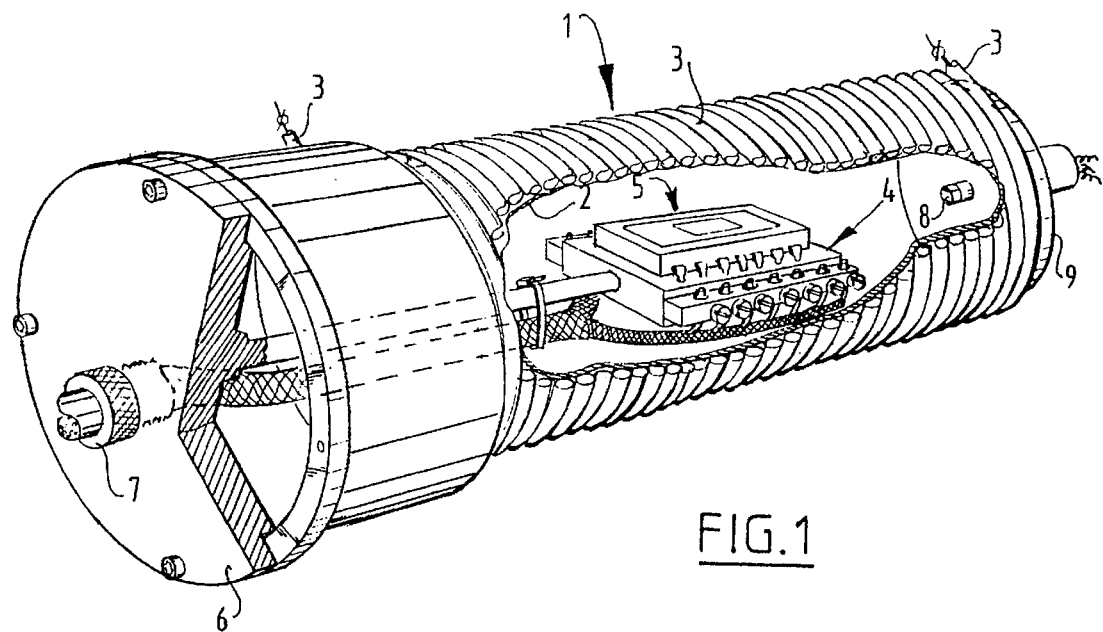
FIG. 1 is a perspective view of a first preferred embodiment of an in-situ electromagnetic ageing parameter measuring apparatus of the present invention.

As noted, conventional long-term reliability tests based on accelerated ageing under thermal stress are very time consuming. It can take several thousand hours of testing before a new device can be placed in production. The present invention is directed to a new and faster method (the in-situ method) developed to study the long-term reliability of material systems used in microelectronics. The method can be used for electronic material systems for which the ageing can be characterized by an electrical parameter which is measurable under stress. Examples of such parameters are the dc electrical resistance, ac impedance, or a magnetic property such as a hysteresis curve. Examples of typically measured components include a junction in an active device, metallization regions of a semiconductor device, wire bonds, bump contacts, thick or thin film resistors, film capacitors, and interlayer dielectrics.

The goal of the in-situ method of the present invention is to enable predictions of a component's reliability or parameter value as a function of time to be made over a shorter timescale (typically 24 to 48 hours) than is required when using conventional techniques. There are at least two known ways to reduce the testing time when performing a conventional accelerated ageing test: 1) by increasing the ageing stress, or 2) by increasing the measurement resolution during the test without increasing the ageing temperature. The first approach (increasing the stress) has the disadvantage that it creates a risk of inducing ageing or degradation processes that do not occur under actual operating conditions. Because of this possibility, such tests are not indicative of actual component use and are discouraged.

The second approach, increasing the measurement resolution, is thus better suited to the goals of the present invention. The basic idea of this approach is to make high resolution measurements of the physical parameter, and thereby characterize the ageing of the test component and detect the ageing phenomena on a shorter timescale. In the in-situ method of the present invention, the electrical parameter is measured frequently at the ageing temperature $T_1$, without interrupting the ageing treatment. To enable comparison with ageing data obtained by conventional methods, the electrical parameter is also measured before and after the ageing treatment at 50° C. For in-situ resistance measurements, for example, the sample is placed in a furnace having a temperature stability better than 0.01° C. for 1 hour and better than 0.02° C. for 24 hours. The temperature gradient within the oven is typically smaller than 0.1° C. This high degree of temperature stability is essential for the in-situ technique, since temperature instability is the main factor limiting the resolution of the parameter measurements. A very stable oven temperature, coupled with high resolution measurements, permits a user to distinguish the physical processes which are the basis of the ageing phenomena and behavior of the component from the temperature dependence of the parameter value (expressed in terms of the temperature coefficient of the parameter).

FIG. 1 is a perspective view of a first preferred embodiment of an in-situ electromagnetic ageing parameter measuring apparatus of the present invention. A substantially tubular oven 1 comprises a stainless steel wall 2 (which in this embodiment has a thickness of approximately 0.38 mm) around which is wound a chrome vanadium wire 3 having a quartz coating. Because of the thin wall and the quartz coating of chrome vanadium wire 3 (which exhibits a small temperature dependence), rapid control of the temperature in the interior of tubular oven 1 is possible. Disposed in tubular oven 1 is a holder 4 on which is situated a component 5 having an electromagnetic ageing parameter. In the embodiment shown in FIG. 1, component 5 is a housing for an integrated circuit. Bundled connecting wires 7 are used to measure the electromagnetic parameter of component 5. Wires 7 are guided through a flange 6, where wires 7 are fed through integrally without being broken and are bonded by an adhesive, such as Araldite. Arranged in the end flange 9 is a temperature sensor 8 for measuring the internal temperature in tubular oven 1. An inert gas, air, or oxygen can be admitted into tubular oven 1 to provide a desired atmosphere for measurement of the electromagnetic ageing parameter.

Figure 2:
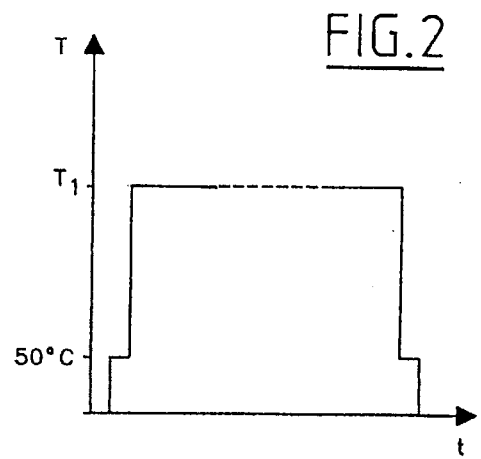
FIG. 2 is a graph showing the temperature as a function of time during the period in which a typical set of electromagnetic ageing parameter values is measured by the apparatus of the present invention.

Using wire 3, the temperature in oven 1 is first brought to a desired temperature, for example 50° C. After reaching this temperature a measurement is made of the value of the electromagnetic parameter (in this case the resistance) of component 5. After this measurement, a series of parameter measurements are made at a temperature $T_1$, where $T_1$ can have a range of values depending upon the parameter being measured. After the measurements are made at the temperature(s) $T_1$, another measurement is made at 50° C. FIG. 2 is a graph showing the temperature as a function of time during the period in which the set of electromagnetic ageing parameter values described above is measured by the apparatus of the present invention. The typical time for making the entire set of measurements is 24–48 hours, which is significantly less than that required for conventional ageing tests.

The measured data is then fit to a curve of the form:

$$\Delta P/P = At^n,$$

where P is the measured electromagnetic parameter, A is a constant, t is the variable time, and n is a real number representing the order of the physical process associated with the ageing of the component.

The $\Delta P/P$ curve can then be used to predict the value of the electromagnetic ageing parameter as a function of time for times beyond that during which the measurements were performed.

The $\Delta P/P$ function discussed above is only one example of a possible relationship for the parameter variation as a function of time, and other forms of the $\Delta P/P$ relationship may be used for curve fitting purposes. The $dP/P$ form used in any particular instance depends upon the physical model adopted to explain the ageing process, and to some extent upon the parameter (P) being measured and whose ageing behavior is being predicted. For example, other possible forms for the $\Delta P/P$ function which describes the drift of an electromagnetic ageing parameter are:

$$\Delta P/P = At^n + B$$

$$\Delta P/P = At^n + B \log t$$

$$\Delta P/P = At^n + B \log t + C$$

$$\Delta P/P = At^n \log t$$

$$\Delta P/P = At^n \log t + B$$

$$\Delta P/P = At^n + Bt^n \log t$$

$$\Delta P/P = At^n + Bt^n \log t + C,$$

where A, n, B, C, and D are coefficients which are determined by fitting the measured data to the equation. Note that the above equations are abstract mathematical formulas, the forms of which approximate the real processes being measured by the apparatus and method of the present invention.

Figure 3:
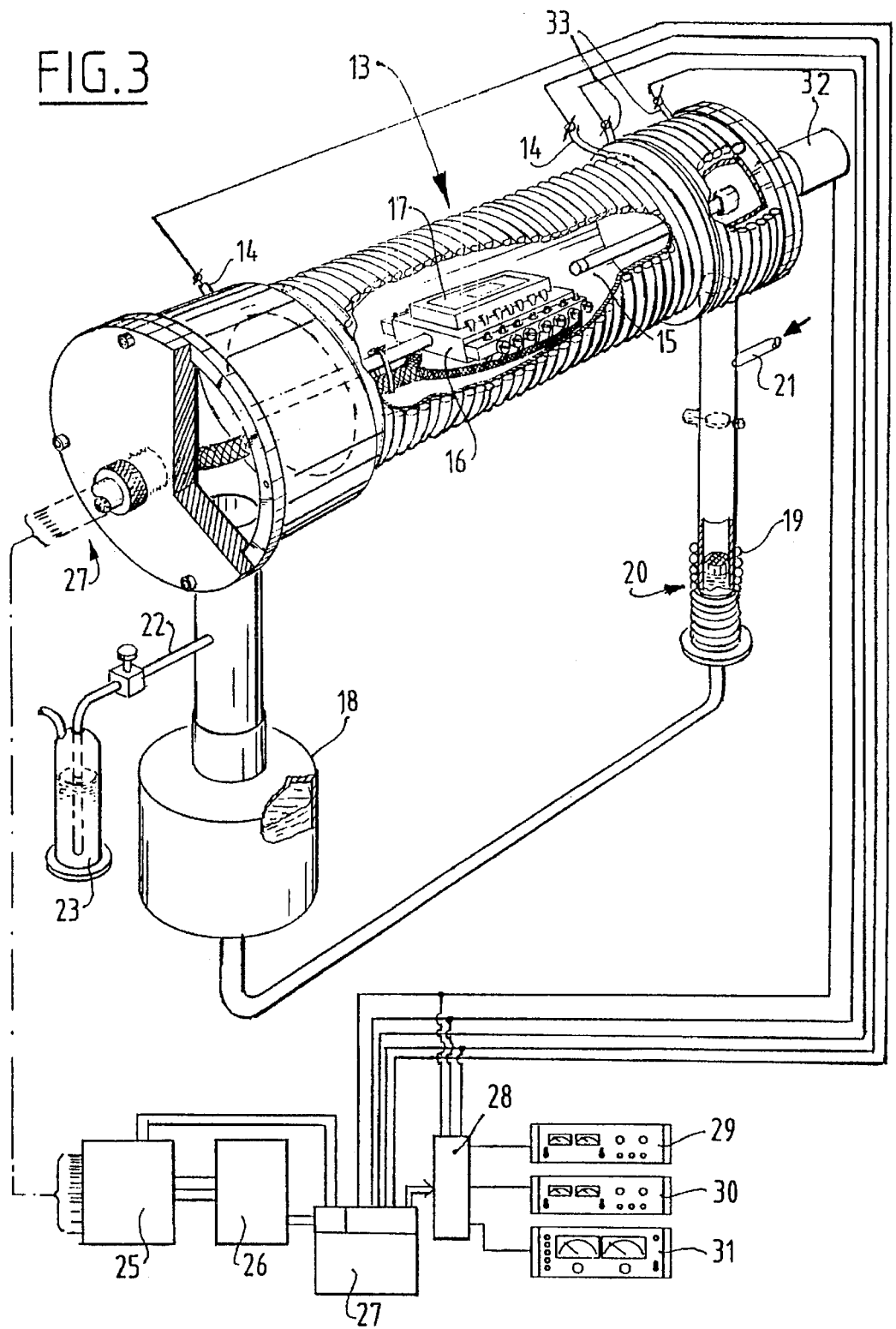
FIG. 3 is a perspective view of a second preferred embodiment of an in-situ electromagnetic ageing parameter measuring apparatus of the present invention.

FIG. 3 is a perspective view of a second preferred embodiment of an in-situ electromagnetic ageing parameter measuring apparatus of the present invention. In the embodiment, a tubular oven 13 is provided with a bifilar winding resistance wire 14 to further increase the speed with which the temperature prevailing in oven 13 may be regulated. The temperature is measured with a temperature sensor 15 disposed close to a holder 16 for an component 17 having an electromagnetic ageing parameter. Component 17 is preferably fixedly clamped onto holder 16. Temperature sensor 15 preferably comprises a Pt-100 resistor which produces a more accurate measurement than a typical thermocouple. Coupled with tubular oven 13 is a water reservoir 18 as well as an evaporating unit 20 provided with a resistance wire 19. A gas can be introduced into tubular oven 13 via a supply 21. A gas discharge 22 is provided with a gas water bottle 23 in order to maintain pressure in oven 13 and keep the mass flow of the gas constant. Other types of mass flow meters can also be used for the same purpose. These features provides a means of producing a desired type of atmosphere in which to conduct the parameter measurements.

The schematically indicated connecting wires 24 for component 17 are coupled via a multiplexer 25 to a digital multimeter 26 with a control unit 27 such as a personal computer. This is in turn coupled via a control unit 28 to supplies 29, 30 and 31, which are for supplying the power required by resistance wire 14, for a front oven 32 which in the present embodiment is provided with connections 33 for sensing its internal state, and for evaporating unit 20, respectively.

Front oven 32 is provided with a temperature and humidity sensor (not shown). An air atmosphere of 85% humidity at 85° C. is usually maintained in front oven 32, although these conditions may be varied depending upon the desired application of the present invention. Connecting wires 24 are preferably insulated with a kapton covering in the embodiment shown in FIG. 3 (wherein the oven temperature is approximately 260° C.), but at higher temperatures (800°–1,000° C.) wires 24 are usually arranged without insulation or with a quartz coating. Four wires are typically used per parameter measurement (i.e., this is a four-point measurement using 2 current wires and 2 voltage wires).

If the temperature in the space in which the above described embodiment of the present invention is operated varies relatively slowly (for instance less than 1° C./hour), such as in a non-conditioned space, the oven temperature can be regulated with a stability of 0.001° C. This permits the high resolution measurements on which the method of the present invention is based to be performed. Thermoelectric potential is preferably avoided as far as possible, e.g., it takes on a value of <10 μV/°C. Wires are preferably connected with clamp connections, while the multiplexing unit is provided with relays and coils, wherein the thermoelectric voltages amount to less than 1 μV/10° C.

The device shown in FIG. 3 preferably includes a control algorithm which prevents measurements being made on the component with the electromagnetic ageing parameter when too great a deviation of the temperature from the desired operational temperature occurs. In this way, the control for the supply voltages will not react to possibly erroneous measurements, whereby more stable control of the oven temperature is obtained. A newly read value for the temperature can be compared for this purpose with the average of the three previous temperature values in the oven in order to determine if the temperature is fluctuating so much that it exceeds the desired range.

Because of the extreme temperature stability of the above described preferred embodiment of the present invention, parameter measurements can be performed with high resolution, for instance within 5–100 ppm of the total quantity to be measured. This permits a reliable prediction of the ageing process on the basis of extrapolating the measured values, and can be carried out within a reasonable measuring time. In addition, insight into the underlying physical processes which are responsible for the ageing of the component can be obtained.

The main advantage of the in-situ electromagnetic ageing parameter measurement and prediction method of the present invention is that higher resolution measurements of the parameter drift can be obtained than are possible by using conventional methods. For example, using state of the art technology for temperature control and resistance measurement, a resolution on the order of a few ppm can be obtained on a system with a TCR of 100 ppm/°C. The higher resolution allows a more detailed analysis of the kinetics of the ageing process(es) to be obtained after a total drift of about 500 ppm, which is usually reached after a typical period of only 24 hours. Note that the ageing temperature $T_1$ is the same in the conventional and the in-situ method of the present invention. Thus, the decrease in testing time is not accomplished by a higher ageing temperature, but rather is due to the higher measurement resolution. This means that new, unrealistic, and possibly destructive ageing processes are not introduced into the measurement process.

In order to further demonstrate the operation and benefits of the present invention, the relationship(s) between the measurement resolution, temperature stability of the oven, and the time required for performing the measurements will be discussed in greater detail. If the measured parameter (resistance in this case) is modeled by a physical process of the form:

$$\Delta R/R = At^n,$$

where the relative resistance change $\Delta R/R$ is typically expressed in units of parts per million (ppm), then at the end of a measurement process of duration $\Delta t$, the relative resistance change is given by:

$$\Delta R/R = A(\Delta t)^n.$$

The measurement resolution (MR, again typically expressed in parts-per-million) can be expressed as:

$$MR = TCR \cdot \Delta T,$$

where TCR is the temperature coefficient of resistance (typically expressed as ppm/° C.), of the parameter being measured, and $\Delta T$ is the temperature stability (in °C.) of the measurement system. A parameter, Z, which reflects the degree of accuracy with which the parameter can be monitored (and hence predicted over longer timescales) can be defined as:

$$Z = (\Delta R/R)/MR.$$

Note that for making reliable predictions of the value of an ageing parameter, a Z value of approximately 100 is desirable. In contrast, conventional systems used for ageing parameter determinations have Z values on the order of 5. Combining the above relationships gives an estimate of the total time ($\Delta t$) required to conduct the ageing measurements:

$$\Delta t = \left\{ \frac{TCR \cdot \Delta T \cdot Z}{A} \right\}^{1/n}$$

The required level of temperature stability ($\Delta T$) for conducting the ageing parameter measurements as a function of the measurement time ($\Delta t$) can be derived from the previous equation, when values for TCR, Z, and A are known:

$$\Delta T = \frac{(\Delta t^n) \cdot A}{TCR \cdot Z}$$

For most physical processes, the order of the physical process associated with the ageing of the component, n, is in the range of 0.2 to 1.0. The above result indicates that for a given material system, the total measurement time required for the present invention is proportional to $(\Delta T)^{1/n}$. Thus, using an oven or furnace having a high degree of temperature stability results in measurement times ($\Delta t$) which are significantly less than those obtained in measurement systems having larger variations in temperature. As an example, the table below shows the measurement time required for a conventional component ageing system and the high resolution measurement system of the present invention for two values of n:

| System | $\Delta T$ | $\Delta t$ (n = 1) | $\Delta t$ (n = 0.5) |
| --- | --- | --- | --- |
| Conventional | ±0.5 °C. | 50 days | 2500 days |
| High resolution | ±0.01 °C. | 1 day | 1 day |

The data presented in the table indicates that smaller values of n result in very long measurement times if a system lacking a high degree of temperature stability is used. For this reason, a lower value of the parameter Z is often used in such systems. While this reduces the measurement time, the resulting data is less useful (if at all) for purposes of predicting the long term behavior of the ageing parameter.

The relationships between the measurement resolution, temperature stability of the oven, and the time required for performing the measurements discussed above can also be used to determine one or more of those quantities given information regarding the component being measured. For instance, if the temperature coefficient of the parameter being measured (the TCR in the case of resistance) is known, then given the temperature stability of the oven, $\Delta T$, the measurement resolution, MR, can be determined. If the value of the parameter Z is assumed to be 100 (as is desirable for predicting the long term behavior of the component), then $\Delta R/R$ can be determined. Similarly, if the parameter Z is set, the relationship between the measurement time, $\Delta t$, and the temperature stability, $\Delta T$, can be used to investigate the trade-offs between those two parameters and assist in designing the oven to be used for the measurements.

The in-situ ageing method of the present invention has been successfully applied to a number of electronic material systems:

(1) Predicting the end of life of thick film resistors;

(2) The defect annealing and oxidation of wires used in off-chip bonding;

(3) Studying ageing phenomena at Au-Al interfaces (Au wire ball bonds on Al-metallizations);

(4) In and out diffusion of oxygen in superconducting films;

(5) Leakage current measurements on thick film dielectrics;

(6) Stress relaxation phenomena in Al-Si interconnections; and (7) Optimization of drift properties of thin film resistors. The present invention can be used both to assist in predicting the values of an ageing parameter over the lifetime of a component or system by fitting the collected data to a curve and extrapolating the result, and as a means of comparing the performance of two systems by performing high resolution measurements of the parameter values. In the latter situation the curve fitting and extrapolation steps may not be required.

As indicated in the previous discussions, the apparatus and method of the present invention can be used for two distinct purposes:

(1) To enable a prediction of an electromagnetic ageing parameter value over the lifetime of a component based on a relatively brief set of high resolution measurements; and (2) To investigate the physical processes responsible for the ageing phenomena and attempt to model those processes.

While most of the preceding description of the invention has been directed to the first purpose, an example of the second use of the present invention will now be discussed. The example discussed concerns an investigation of the long term reliability of thick and thin film resistors and sensors.

In order to determine whether the observed phenomena of resistance drift is caused by a) changes of the bulk material or b) diffusion at the contact interface, the ageing behavior of resistors with different lengths and widths can be measured. All of the measurements were performed at a temperature below 200° C. (thereby preventing any overstress) within a 2 day period. Due to the oven temperature stability of 0.02° C. over 24 hours, the resistance drift can be measured with a resolution of a few ppm. This makes the variation of the electromagnetic parameter due to ageing on the same order as its variation due to temperature fluctuations (since TCR for this example is <200 ppm/C). In conventional methods using less stable ovens, the variation due to temperature can approach 100 ppm and thus be an order(s) of magnitude greater than the variation due to ageing. The ability to limit temperature induced fluctuations in the parameter value and thereby isolate the parameter changes as a result of ageing is the reason that the present invention can be used to predict parameter values based on a much shorter measurement time.

Figure 4:
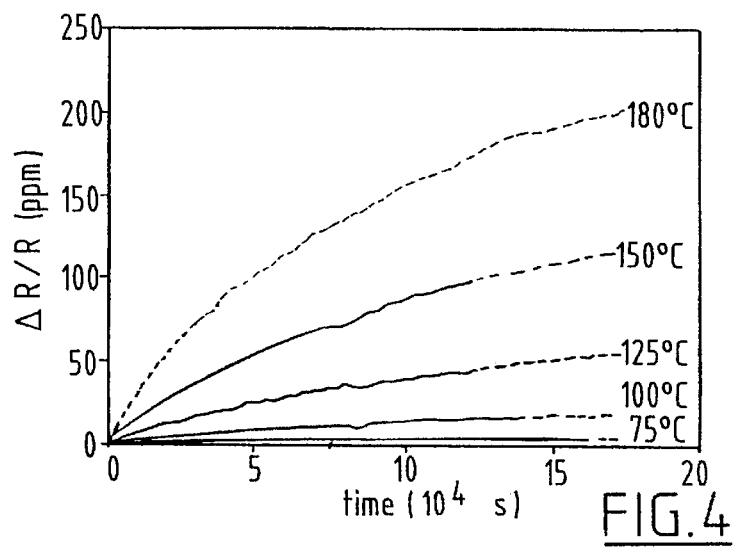
FIG. 4 shows the ageing behavior of the resistance of thick film resistors at different ageing temperatures.
Figure 5:
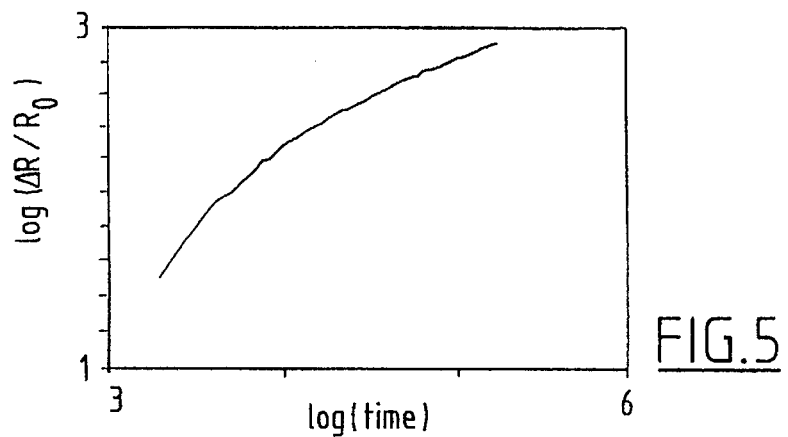
FIG. 5 shows the data of FIG. 4 after conversion of the time axis data to log(t), and suggests that several mechanisms are responsible for the ageing process of a thick film resistor.

The ageing behavior ($\Delta R/R$) at different ageing temperatures of the thick film resistors described above is shown in FIG. 4. The conversion of the time axis data to log(t) suggests that several mechanisms are responsible for the ageing process of the thick film resistors (see FIG. 5). This is because the relative change versus log(t) graph shows a straight line when only one Arrhenius-type ageing mechanism is active, where such mechanisms are modeled by a relationship of the form $R(t)=Ae^{-\lambda t}$.

Figure 6:
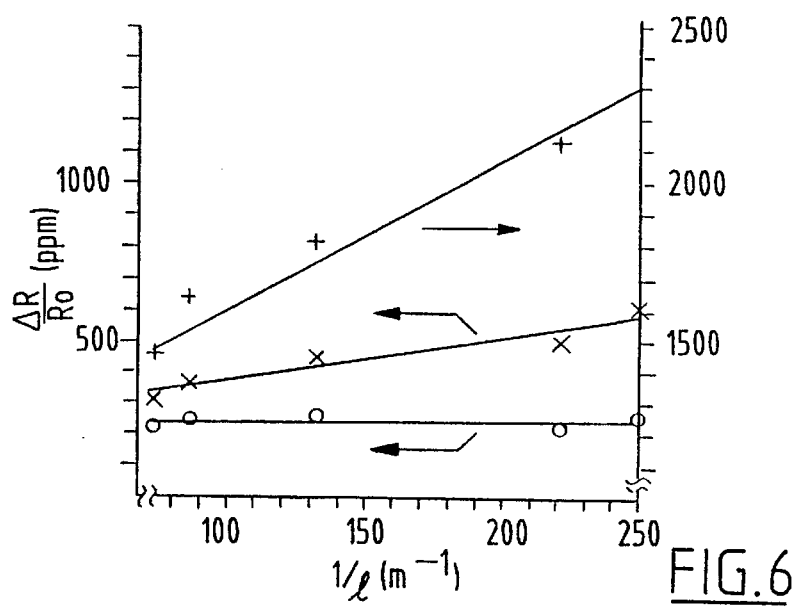
FIG. 6 is a plot of the data from FIG. 4 which compares the resistor drift to the inverse of the resistor length, and indicates a nearly linear relationship between those two quantities.

When the data is plotted, the resistor drift ($\Delta R/R$) shows a nearly linear relationship to the inverse of the resistor length (see FIG. 6). This is a strong indication that the drift is caused by diffusion at the contact region. Based on this result the value assumed by the variable (n) in the equation for $\Delta P/P$ can be compared to the results of research into the physical processes occurring in the type of component under test. This will provide an indication of the dominant physical process(es) responsible for the drift of the measured parameter. Since the slope of the straight line increases with increasing square resistance, it can be concluded that the drift effect due to diffusion at the contact region becomes more and more important for higher square resistance resistor materials.

Figure 7:
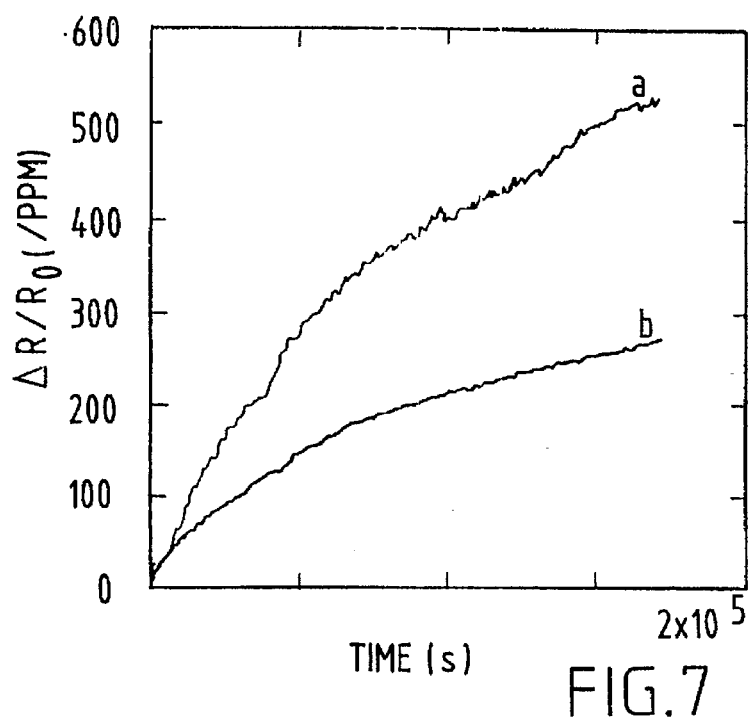
FIG. 7 is a graph showing the ageing behavior of a thin film resistor having a diffusion barrier A, and indicates the behavior of both the contact region and the bulk material.
Figure 8:
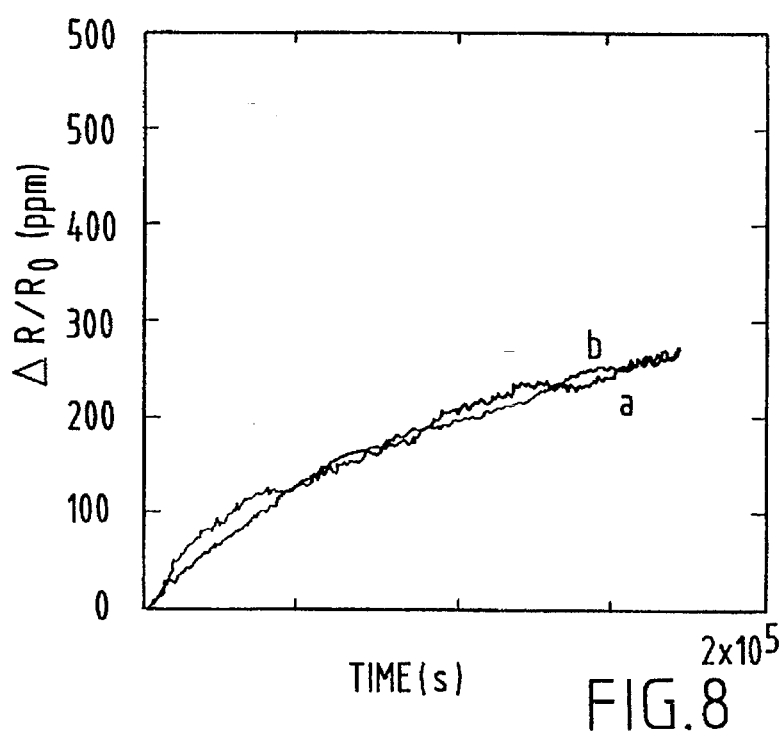
FIG. 8 is a graph showing the ageing behavior of a thin film resistor having a diffusion barrier B, and indicates the behavior of both the contact region and the bulk material.

In another application of the present invention, a test structure was developed to study the efficiency of an applied diffusion barrier at the contact interface of a thin resistor. The test system allowed measurement of the resistance drift of the bulk material as well as the drift caused by diffusion at the contact interface. All measurements were performed at a temperature 150° C. over a period of 2 days. The ageing behavior of a thin resistor's bulk material (the curves labelled "b") and contact region (the curves labelled "a") for two different diffusion barriers (A and B) was measured (see FIGS. 7 and 8, respectively). For diffusion barrier B (FIG. 8), no difference is apparent between the drift of the bulk material and the contact region, indicating that diffusion barrier B is working property. The measured data can be fit to an equation of the form:

$$\Delta R/R_0 = At^n,$$

where t is time and n is a real value. After determining A and n by curve fitting to the measured data, the resistance drift versus time, R(t), can be calculated. Based on the data measurements made over the first 48-hours, the expected drift after 1,000 hours was extrapolated (see the column labelled ($\Delta R/R$) extr. 1000 hr in-situ in Table 1 below) and compared with the results of a conventional off-line testing system. The results are shown in Table 1, which indicates that the extrapolation of the ageing behavior for the resistors based on the measurements made during the first 48 hours is in agreement with the results of the conventional test, i.e., the predicted values are within the accuracy of the off-line results.

TABLE 1

| Device | ($\Delta R/R$) extr.1000 hr in-situ | (dr/R) 1000 hr off-line |
| --- | --- | --- |
| A bulk | (1350 + 200) ppm | |
| A contact | (3500 + 200) ppm | |

TABLE 1-continued

| Device | (ΔR/R) extr.1000 hr in-situ | (dr/R) 1000 hr off-line |
|---|---|---|
| A entire | (1565 + 200) ppm | (1800 + 400) ppm |
| B bulk | (1600 + 200) ppm | |
| B contact | (1550 + 200) ppm | |
| B entire | (1550 + 200) ppm | (1300 + 500) ppm |

Although the above described embodiments relate to ageing processes of an element with dc resistance values, the present invention can also be applied to studies of capacitance (or induction) measurements, or other electromagnetic quantities. Additionally, the studies may be performed under various types of loads, such as mechanical tensile strain (off-chip connections), current load (for the purpose of studies into electron migration), etc.

In summary, the present invention is directed to an apparatus and method for determining the ageing behavior of a component having an electromagnetic parameter which ages over the lifetime of the component. High resolution measurements (corresponding to a small value of the measurement resolution, MR) of the parameter value are made at a testing temperature in an oven having a very high degree of temperature stability (a small value of ΔT). The temperature stability assures that the changes of the electromagnetic parameter as a result of temperature fluctuations (i.e., the measurement resolution, MR) are negligible (or at least of the same order) relative to the parameter changes resulting from the ageing phenomena which occur in the component being tested (expressed as ΔR/R for resistance measurements).

This situation acts to isolate the cause(s) of the parameter changes, and provides confidence that the measured variations in the parameter are the result of the physical processes responsible for the degradation of the component, rather than the dominating effect of the temperature dependence of the parameter value (which is typically expressed as the temperature coefficient of that parameter). The temperature stability means that even for components having relatively large values of the temperature coefficient, the measured value will vary little due to that process. In combination with the relatively small variations owing to ageing, this permits high resolution (low variation or scatter) measurements to be made. The high resolution measurements permit more reliable predictions of the value the parameter will have over the component's lifetime.

The very stable oven temperature coupled with the ability to make high resolution measurements permits distinguishing between the physical processes which form the basis of the ageing phenomena, and can provide a tool for predicting the parameter value over the lifetime of the component. This serves as a means of studying and modeling the degradation processes responsible for the ageing of the component. In addition, the present invention permits the measurements to be made over a much smaller timescale than required by conventional methods. The shorter measurement timescale is obtained by decreasing the temperature fluctuation (ΔT) during the measurement process, and hence increasing the measurement resolution (MR), resulting in a larger value of the parameter Z. This is in contrast to conventional ageing methods and burn-in techniques in which components are stressed to a greater degree (typically by increasing the ageing temperature so as to increase the parameter drift, ΔP/P) in order to decrease the data measurement time. The combination of high resolution and short timescale measurements makes the present invention ideally suited to studies of the reliability of electronic components as they age over their lifetime.

As has been discussed, in conducting measurements of an electromagnetic ageing parameter using the apparatus and/ or method of the present invention, several variables are of importance. Firstly, the temperature coefficient of the parameter to be measured should be known. This will provide an indication as to the degree of oven temperature stability necessary in order to make measurements of the ageing parameter which are not dominated by the effects of temperature induced parameter variation. Once the required oven tolerance is known (or the magnitude of the temperature induced variation is known), the parameter measurements can be made. These measurements will have a high resolution and little scatter, since the primary factor which would produce short term, large magnitude variations will have been removed due to the oven's temperature stability.

The high resolution measurements form the basis for modeling the ageing behavior and predicting the parameter value over the lifetime of the component. Because the measurements can be made at a high resolution, a relatively short time period is needed to make the measurements necessary to predict the parameter value. This is an important benefit of the present invention when compared to conventional systems. In addition, because the short time period for data measurement is obtained by an increased oven temperature stability (and hence better measurement resolution) instead of stressing the component, the results are a more reliable indication of how the component will perform over time under expected operational conditions.

The present invention can be used for research and development, component design, or quality control of manufactured components. The present invention can be applied to a wide variety of components, including thin- or thick-film resistors, YBaCuO films or other ceramic (superconducting) layers, Cu and Al wires or alloys thereof used for bonding integrated circuits, Al, Au and Cu interconnections, flip-chip and bump connections, amorphous metal alloys, quasi crystals and/or soldered (Pb/Si) melting fuses, etc.

Although the present invention has been described with reference to measuring resistance values and a model of the resistor drift having a particular form ($\Delta P/P = At^n$), it is noted that other electromagnetic parameters may be easily measured and predicted using the same techniques. In such a case, the form for $\Delta P/P$ may vary depending upon the parameter measured and the physical processes responsible for the degradation in value of that parameter. In addition, the form of the relationships previously described for ΔR/R and Δt will vary accordingly.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed.

We claim:

1. A method for studying the change of an electromagnetic ageing parameter of a component over time, comprising the steps of:

placing the component in an oven at a predetermined temperature;

controlling the oven temperature so that the temperature has a sufficiently small variation that a parameter Z has a value approximately equal to 100, wherein Z is defined as $$Z = (\Delta P/P)/MR,$$

where P is an ageing parameter of the component being measured, ΔP/P is the relative change in a value of P during a measurement process of duration Δt, and MR is a temperature dependent measurement resolution, thereby causing measured changes in the value of the component's ageing parameter to be predominantly a result of ageing of the component instead of temperature dependent changes of the parameter value; and measuring a value of the electromagnetic ageing parameter of the component while it is in the oven at this temperature, wherein a plurality of measurements of the parameter are made over a time period of less than 48 hours.

2. The method of claim 1, further comprising the steps of:
    fitting a curve to the measured data to produce a curve of the parameter value versus time; and
    extrapolating the parameter value versus time curve to extend to later times, thereby enabling a prediction of the parameter value as the component ages.

3. The method of claim 1, wherein the oven is heated by means of a heating wire closely wound around the oven.

4. The method of claim 3, further comprising the step of:
    controlling the oven temperature by sensing the temperature in the oven and controlling the heat supplied to the oven by the heating wire based on the sensed temperature.

5. The method of claim 1, wherein the oven is controlled to a temperature variation of 0.001° C.

6. The method of claim 1, wherein the curve fit to the measured value is of the form $\Delta P/P = At^n$, where P is the measured electromagnetic parameter, A is a constant, t is the variable time, and n is the order of the physical process associated with the ageing of the component.

7. The method of claim 1, wherein the curve fit to the measured value is of the form $\Delta P/P = At^n + B \log t$, where P is the measured electromagnetic parameter, A and B are constants, t is the variable time, and n is the order of the physical process associated with the ageing of the component.

8. The method of claim 1, wherein the curve fit to the measured value is of the form $\Delta P/P = At^n \log t + B$, where P is the measured electromagnetic parameter, A and B are constants, t is the variable time, and n is the order of the physical process associated with the ageing of the component.

9. The method of claim 1, wherein the curve fit to the measured value is of the form $\Delta P/P = At^n + Bt^n \log t + C$, where P is the measured electromagnetic parameter, A, B, and C are constants, t is the variable time, and n is the order of the physical process associated with the ageing of the component.

10. The method of claim 1, wherein the oven in which the component is placed is of a tubular shape, and further, wherein the oven temperature is controlled by using a heating wire wound around the oven.

11. An apparatus for determining the change of an electromagnetic ageing parameter of a component with time, comprising:
    a substantially tubular oven;
    a holder for the component disposed in the oven;
    a sensor for recording the temperature in the oven;
    a heating wire wound around the oven for changing the temperature in the oven;
    a supply of electric power for the heating wire;
    means for measuring a value of the electromagnetic ageing parameter of the component while it is in the oven; and
    a control unit connected to the temperature sensor and to the supply of electric power for the heating wire, for controlling the electric power supplied to the heating wire and the temperature in the oven as a function of a temperature sensed by the temperature sensor, wherein the oven temperature is controlled so that the temperature has a sufficiently small variation that a parameter Z has a value approximately equal to 100, wherein Z is defined as $$Z = (\Delta P/P)/MR,$$

where P is an ageing parameter of the component being measured, $\Delta P/P$ is the relative change in a value of P during a measurement process of duration $\Delta t$, and MR is a temperature dependent measurement resolution, thereby causing measured changes in the component's ageing parameter value to be predominantly a result of ageing of the component instead of temperature dependent changes of the parameter value.

12. The apparatus of claim 11, wherein the heating wire is composed of a chrome vanadium alloy.

13. The apparatus of claim 12, wherein the heating wire is covered with a quartz coating.

14. The apparatus of claim 11, wherein the heating wire is a bifilar winding around the oven.

15. The apparatus of claim 11, wherein the control unit includes means for deactivating the means for measuring the value of the electromagnetic ageing parameter of the component when the temperature in the oven exceeds a predetermined value.

16. The apparatus of claim 11, further comprising:
    means for fitting a curve to the measured values of the electromagnetic ageing parameter; and
    means for extrapolating the fitted curve to later times to produce a curve which predicts the value of the elctromagnetic ageing parameter as a function of time over the lifetime of the component.

17. The apparatus of claim 16, wherein the means for fitting a curve to the measured values of the electromagnetic ageing parameter fits the data to a curve of the form $\Delta P/P = At^n$, where P is the measured electromagnetic parameter, A is a constant, t is the variable time, and n is the order of the physical process associated with the ageing of the component to the measured data.

18. The apparatus of claim 16, wherein the means for fitting a curve to the measured values of the electromagnetic ageing parameter fits the data to a curve of the form $\Delta P/P = At^n + B \log t$, where P is the measured electromagnetic parameter, A and B are constants, t is the variable time, and n is the order of the physical process associated with the ageing of the component.

19. The apparatus of claim 16, wherein the means for fitting a curve to the measured values of the electromagnetic ageing parameter fits the data to a curve of the form $\Delta P/P = At^n \log t + B$, where P is the measured electromagnetic parameter, A and B are constants, t is the variable time, and n is the order of the physical process associated with the ageing of the component.

20. The apparatus of claim 16, wherein the means for fitting a curve to the measured values of the electromagnetic ageing parameter fits the data to a curve of the form $\Delta P/P = At^n + Bt^n \log t + C$, where P is the measured electromagnetic parameter, A, B, and C are constants, t is the variable time, and n is the order of the physical process associated with the ageing of the component.

21. The apparatus of claim 11, wherein the control unit controls the oven temperature to a variation of 0.001° C.

* * * * *